(12) United States Patent
Lee

(10) Patent No.: US 10,175,821 B2
(45) Date of Patent: Jan. 8, 2019

(54) TOUCH CALIBRATION SYSTEM AND METHOD THEREOF

(71) Applicant: Feeling Technology Corp., Chupei, Hsinchu County (TW)

(72) Inventor: Kun-Hsu Lee, Chupei (TW)

(73) Assignee: ADVANCED ANALOG TECHNOLOGY, INC., Zhubei, Hsinchu County (TW)

( * ) Notice: Subject to any disclaimer, the term of this patent is extended or adjusted under 35 U.S.C. 154(b) by 381 days.

(21) Appl. No.: 15/082,427

(22) Filed: Mar. 28, 2016

(65) Prior Publication Data

US 2017/0052641 A1   Feb. 23, 2017

(30) Foreign Application Priority Data

Aug. 19, 2015   (TW) .............................. 104126972 A

(51) Int. Cl.
    *G06F 3/041*   (2006.01)
    *H03K 17/96*   (2006.01)
    *G06F 3/044*   (2006.01)

(52) U.S. Cl.
    CPC ......... *G06F 3/0418* (2013.01); *H03K 17/962* (2013.01); *G06F 3/044* (2013.01); *H03K 2217/94031* (2013.01)

(58) Field of Classification Search
    CPC ..... G06F 3/0418; G06F 3/044; H03K 17/962; H03K 2217/94031
    See application file for complete search history.

(56) References Cited

U.S. PATENT DOCUMENTS

| | | | | |
|---|---|---|---|---|
| 5,262,766 A | * | 11/1993 | Sakamoto | ................ G09G 3/30 345/691 |
| 6,046,965 A | * | 4/2000 | Oba | ........................ G04F 1/005 368/250 |
| 2004/0246149 A1 | * | 12/2004 | Fedigan | ................. H03M 11/24 341/22 |
| 2008/0162996 A1 | * | 7/2008 | Krah | ..................... G06F 1/3203 714/27 |
| 2010/0253647 A1 | * | 10/2010 | Agari | .................... G06F 3/0416 345/174 |
| 2011/0007028 A1 | * | 1/2011 | Curtis | ................... G06F 3/0418 345/174 |
| 2011/0186359 A1 | * | 8/2011 | Chen | ....................... G06F 3/044 178/18.06 |

(Continued)

*Primary Examiner* — Jose Soto Lopez
(74) *Attorney, Agent, or Firm* — Muncy, Geissler, Olds & Lowe, P.C.

(57) ABSTRACT

A touch calibration system and method thereof are provided in the present invention. When a touch pad stops receiving a touch signal generated from a user to make the touch calibration system be at a calibration mode, a first step of the touch calibration method is providing a fixed count value to a counter of the touch calibration system. A second step is provided that a wave-generation module generates an oscillation wave, a counter counts an oscillation number corresponding to the oscillation wave, and a timer counts a calibration oscillation time. A third step is provided that determining whether the oscillation number achieves the fixed count value. When the oscillation number achieves the fixed count value, a storage module is received the calibration oscillation time to store the calibration oscillation time.

6 Claims, 8 Drawing Sheets

(56) References Cited

U.S. PATENT DOCUMENTS

| | | | | |
|---|---|---|---|---|
| 2011/0267309 A1* | 11/2011 | Hanauer | ............... | G06F 3/0416 |
| | | | | 345/174 |
| 2012/0113047 A1* | 5/2012 | Hanauer | ............... | G06F 3/0416 |
| | | | | 345/174 |
| 2013/0229382 A1* | 9/2013 | Huang | .................... | G06F 3/044 |
| | | | | 345/174 |
| 2013/0342250 A1* | 12/2013 | Kwon | ..................... | H03L 7/085 |
| | | | | 327/158 |

* cited by examiner

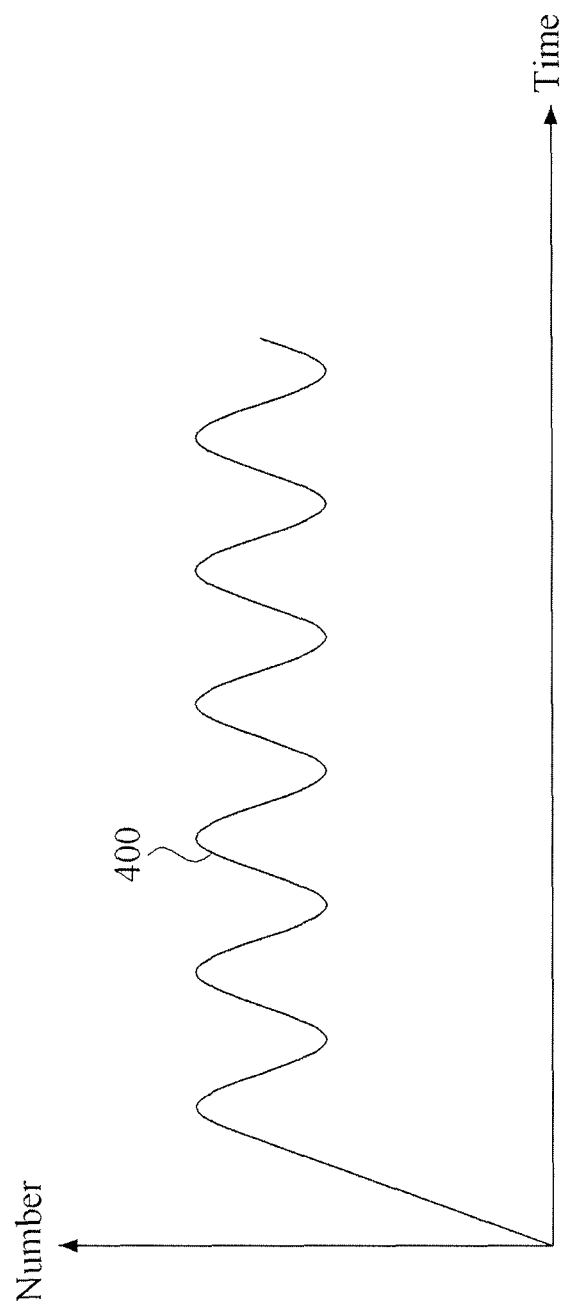

TOUCH CALIBRATION SYSTEM AND METHOD THEREOF

This application claims the benefit of Taiwan Patent Application Serial No. 104126972, filed Aug. 19, 2015, the subject matter of which is incorporated herein by reference.

BACKGROUND OF INVENTION

1. Field of the Invention

The present invention is related to a touch calibration system and a method thereof, and more particularly related to a touch calibration system and a method thereof by using a counter which is set with a fixed count value.

2. Description of the Prior Art

Attending with the progress of technology, the development of network has led to a life full of electronic devices, of which the interface of touch control is the main trend. In order to make sure that the touch control on the electronic devices can run smoothly without trouble, a test for the touch circuit is necessary.

Please refer to FIGS. 1 and 2, wherein FIG. 1 is a block diagram of a conventional touch calibration system, and FIG. 2 is a diagram showing the oscillating wave of the conventional art. As shown, in the existed touch calibration system PA1, a waveform generation module PA12 is electrically connected to a touch pad PA11, a counter PA13 is electrically connected to the waveform generation module PA12, a timer PA14 is electrically connected to the counter PA13 and set with a fixed timer value, and a data computing module PA15 is electrically connected to the counter PA13.

When doing the calibration by using the above mentioned technology, the touch pad PA11 is untouched and the waveform generation module PA12 generates the oscillating waves 100, 200, 300. Concretely speaking, the above mentioned oscillating waves 100, 200, 300 are defined as being composed of an upward section and a downward section. That is, the section between time t0 and t2 in FIG. 2 is the oscillating wave 100, the section between time t2 and t4 is the oscillating wave 200, and the section between time t4 and t6 is the oscillating wave 300. During the calibration, the timer PA14 measures the above mentioned fixed timer value (e.g. 1 ms) and triggers the counter PA13 to count the number of the generated oscillating waves within the fixed timer value when the measured time equals to the fixed timer value. For example, as the fixed time value is the time period between time t0 and t4 in FIG. 2 (i.e. t4 minus t0), then, the counter number would be two, i.e. oscillating waves 100 and 200. Then, the computed data (such as the waveform showing the relationship between the counted number and time) would be transmitted to the data computing module PA15 for computing a result with a better signal to noise ratio (SNR).

However, in general, for the calibration method in which the timer PA14 is set to measure a fixed time value, the data computing module PA15 needs to conduct the switches (not shown) in the waveform generating module PA12 repeatedly to choose the number of constant currents (not shown) for accessing a better signal to noise ratio. Because the calibration method needs to run the test repeatedly, it would spend lots of time and thus is not cost-efficient.

In addition, when determining the existence of a touch, the applicable algorithm of the data computing module PA15 is also restricted by the above mentioned calibration method. Because the determination is based on the number counted by the counter, a complicated method should be used. For example, the data computing module PA15 in practice may use a filter with various filtering coefficients (e.g. eight different filtering coefficients) for computing the counted data from the counter PA13. Such determination would be quite time-consuming and thus there exists a need to improve the technology in present.

SUMMARY OF THE INVENTION

As mentioned, the conventional art proceeding the calibration by setting the timer to measure a fixed time value has the problems of long calibration time and a time-consuming determination process for determining the existence of a touch. Accordingly, a touch calibration system and a method thereof is provided with the feature of having the counter set with a fixed count value to resolve the above mentioned problem.

Based on the aforementioned object, a touch calibration system is provided in accordance with an embodiment of the present invention. The touch calibration system comprises a touch pad, a waveform generation module, a counter, a first timer, and a storage module. The waveform generation module is electrically connected to the touch pad for generating at least an oscillating wave. The counter is electrically connected to the waveform generation module and set with a fixed counter value, for counting an oscillation number of the oscillating wave generated by the waveform generation module under a calibration mode, and transmitting a count signal representing the oscillation number when the oscillation number reaches the fixed count value. The first timer is electrically connected to the timer, for measuring a calibrated oscillating time, and for receiving the count signal to transmitting a timer signal representing the calibrated oscillating time measured by the first timer. The storage module is electrically connected to the first timer, for receiving the timer signal to store the calibrated oscillating time to complete the calibration mode, wherein the calibration mode is defined as that the touch pad stops receiving a touch signal generated from a user.

In accordance with an embodiment of the present invention, a touch calibration method is provided in the present invention. The touch calibration method is applicable to a touch calibration system, for calibrating the touch calibration system under a calibration mode. The touch calibration system includes a touch pad, a waveform generation module, a counter, a first timer, and a storage module, wherein the waveform generation module is electrically connected to the touch pad, the counter is electrically connected to the waveform generation module, the first timer is electrically connected to the counter, the storage module is electrically connected to the first timer. In the touch calibration method, the counter is firstly set with a fixed counter value. Then, at least an oscillating wave is generated by the waveform generation module. Afterward, an oscillation number of the oscillating wave generated by the waveform generation module is counted by the counter, and a calibrated oscillating time is measured by the first timer. Thereafter, a determination is carried out to determine whether the oscillation number reaches the fixed counter value. Finally, if the determination is yes, the calibrated oscillating time measured by the first timer is stored in the storage module. The calibration mode is defined as that the touch pad stops receiving a touch signal generated from a user.

In accordance with a preferred embodiment of the touch calibration system and the method thereof of the present invention, the storage module is a second timer, the first timer is composed of a plurality of T-type flip-flops, the second timer is composed of a plurality of D-type flip-flops, and the waveform generation module is a relaxation oscillator circuit.

By using the touch calibration system and the touch calibration method provided in the present invention, because a fixed counter value rather than a fixed time value is measured, the touch calibration process can be completed with only one calibration step and does not need to charge the constant current capacitor or the grounded capacitor repeatedly. Thus, the calibration time can be significantly reduced.

BRIEF DESCRIPTION OF THE DRAWINGS

The present invention will now be specified with reference to its preferred embodiment illustrated in the drawings, in which:

FIG. 8 is a schematic view of a count data waveform in accordance with a preferred embodiment of the present invention.

DESCRIPTION OF THE PREFERRED EMBODIMENT

There are various embodiments of the touch calibration system and the touch calibration, which are not repeated hereby. Only one preferred embodiment is mentioned in the following paragraph as an example.

Figure 3:
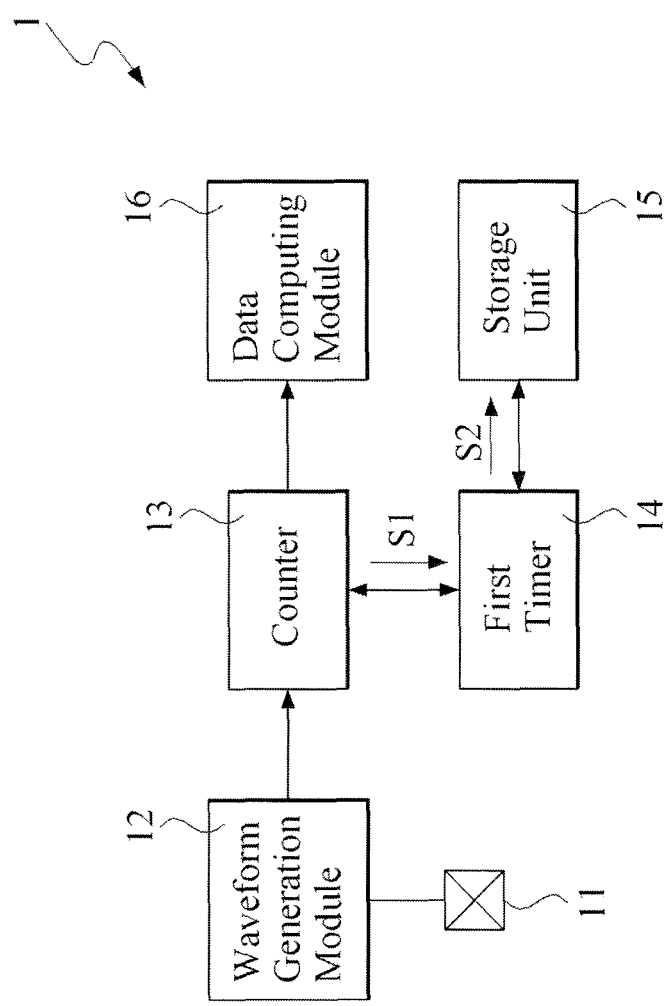
FIG. 3 is a block diagram of a touch calibration system in accordance with a preferred embodiment of the present invention.
Figure 4:
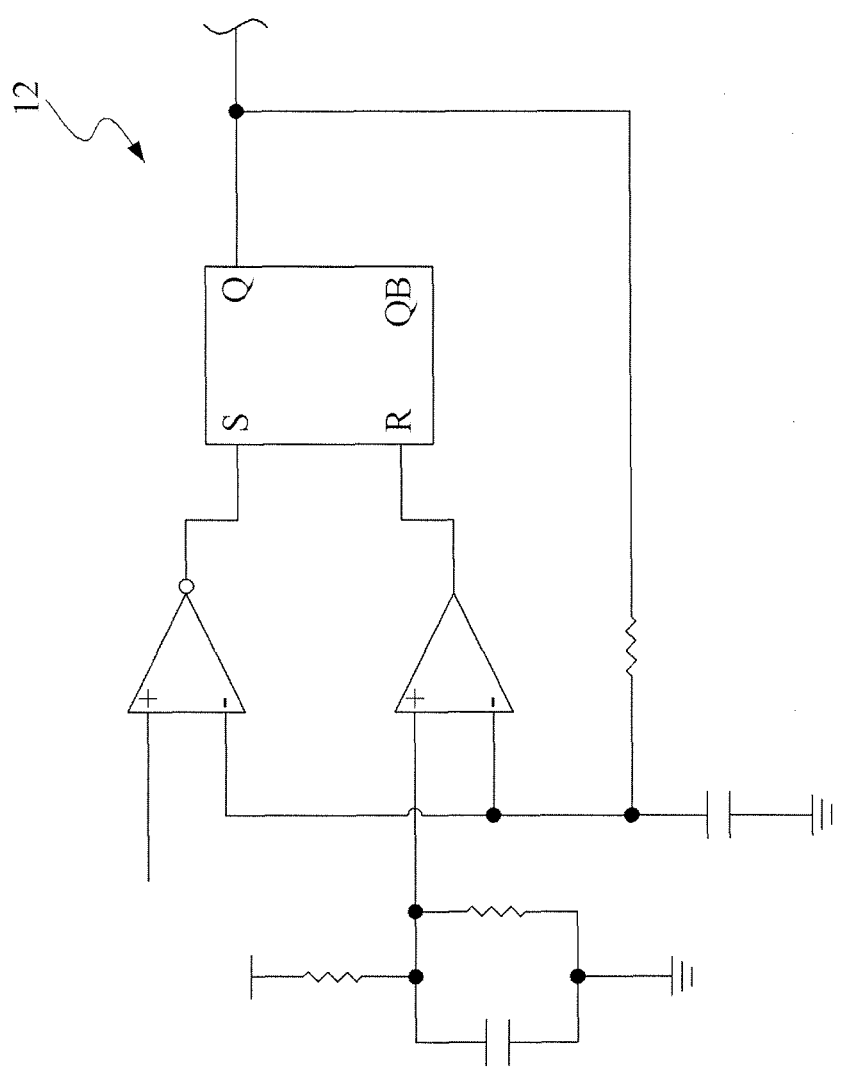
FIG. 4 is a circuit diagram of a waveform generation module in accordance with a preferred embodiment of the present invention.
Figure 5:
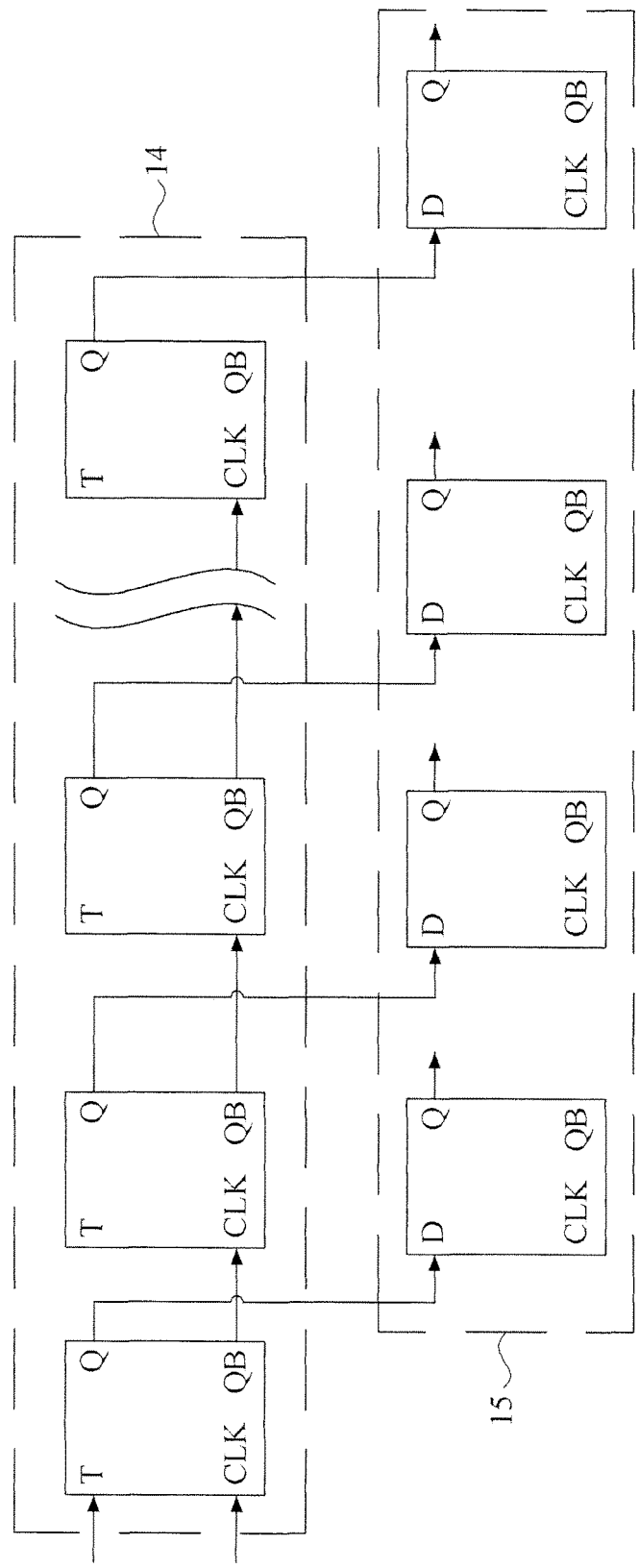
FIG. 5 is a circuit diagram of the first timer and the second timer in accordance with a preferred embodiment of the present invention.

Please refer to FIG. 3 to FIG. 5, wherein FIG. 3 is a block diagram of a touch calibration system in accordance with a preferred embodiment of the present invention, FIG. 4 is a circuit diagram of a waveform generation module in accordance with a preferred embodiment of the present invention, and FIG. 5 is a circuit diagram of the first timer and the second timer in accordance with a preferred embodiment of the present invention.

As shown, the touch calibration system 1 includes a touch pad 11, a waveform generation module 12, a counter 13, a first timer 14, a storage module 15 and a data computing module 16. The touch pad 11 is the device for the user to implement touch control. In general, the touch pad 11 includes capacitors. The waveform generation module 12, such as the relaxation oscillator circuit, is electrically connected to the touch pad 11. The relaxation oscillator circuit shown in FIG. 4, which is composed of SR flip-flops, comparators, resistors and capacitors, is merely an example of the present invention. The present invention is not so restricted. The layout as well as the type of oscillator circuit to be used may depend on the design in practice.

The counter 13 is electrically connected to the waveform generation module 12 and can be composed of at least one T-type flip-flop. In addition, the counter 13 is set with a fixed counter value. The fixed counter value, such as ten-thousand, is preset at the beginning. In the present exemplary embodiment, a fixed counter value of two is used as an example for simplifying the description.

The first timer 14 is electrically connected to the timer 13 and can be composed of a plurality of T-type flip-flops. In addition, the first timer 14 of the present embodiment is not set with a fixed time as described in the conventional art. The storage module 15 is electrically connected to the first timer 14 and can be a second timer. The second timer can be composed of a plurality of D-type flip-flops. However, the present invention is not so restricted. The data computing module 16 is electrically connected to the counter 13 and can be composed of at least one filter (not shown).

Figure 2:
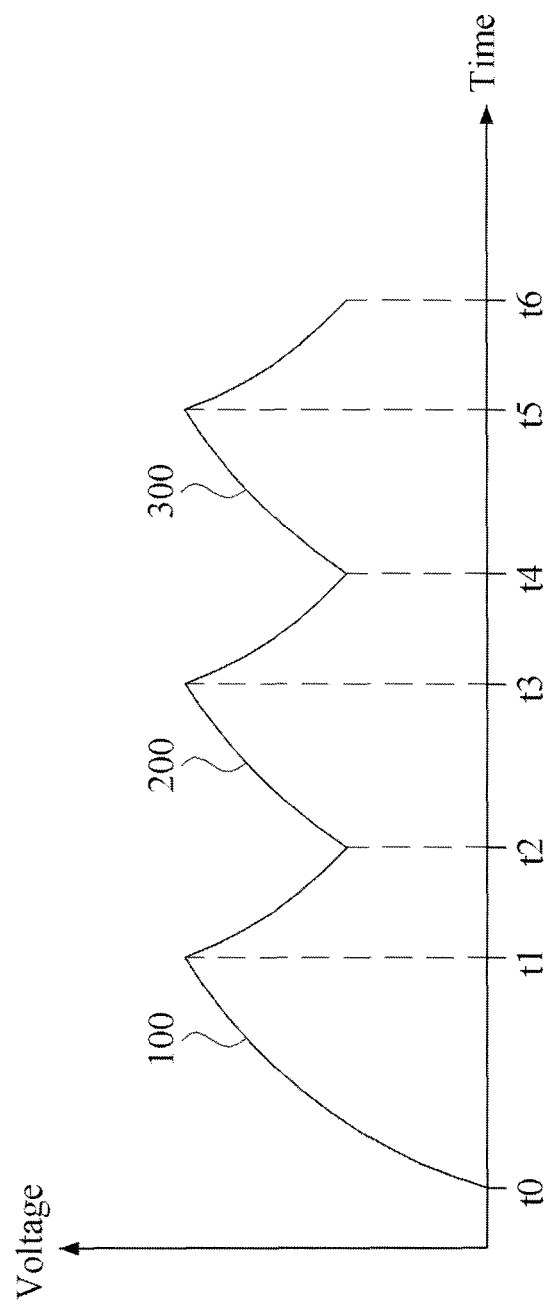
FIG. 2 is a schematic view of an oscillating wave of the conventional touch calibration system.

In practice, as the touch calibration system 1 is operated under a calibration mode (in the present embodiment, the calibration mode is defined as that the touch pad stops receiving a touch signal generated from a user), the waveform generation module 12 will generate the oscillating waves 100, 200, 300 as shown in FIG. 2. Meanwhile, the counter 13 will count the oscillation numbers of the oscillating waves 100, 200, 300 generated by the waveform generation module 12. Because the fixed count value is two, the counter 13 will transmit a count signal S1 representing the oscillation number as the oscillating wave 200 generated by the waveform generation module 12 is counted (i.e. two oscillating waves 100, 200 has been generated and the fixed count value is reached). At the same time, the first timer 14 will measure a calibrated oscillating time and transmit a timer signal S2 representing the calibrated oscillating time measured by the first timer 14 when receiving the count signal S1. For example, as the fixed count value is two, the first timer 14 stops measuring at time t4 (as shown in FIG. 2) and thus the calibrated oscillating time would be the period between time t4 and to. The first timer 14 will transmit the timer signal S2 to the storage module 15 to have the storage module 15 store the calibrated oscillating time as a parameter for actually determining whether there exists a touch and the calibration mode is completed.

Figure 6:
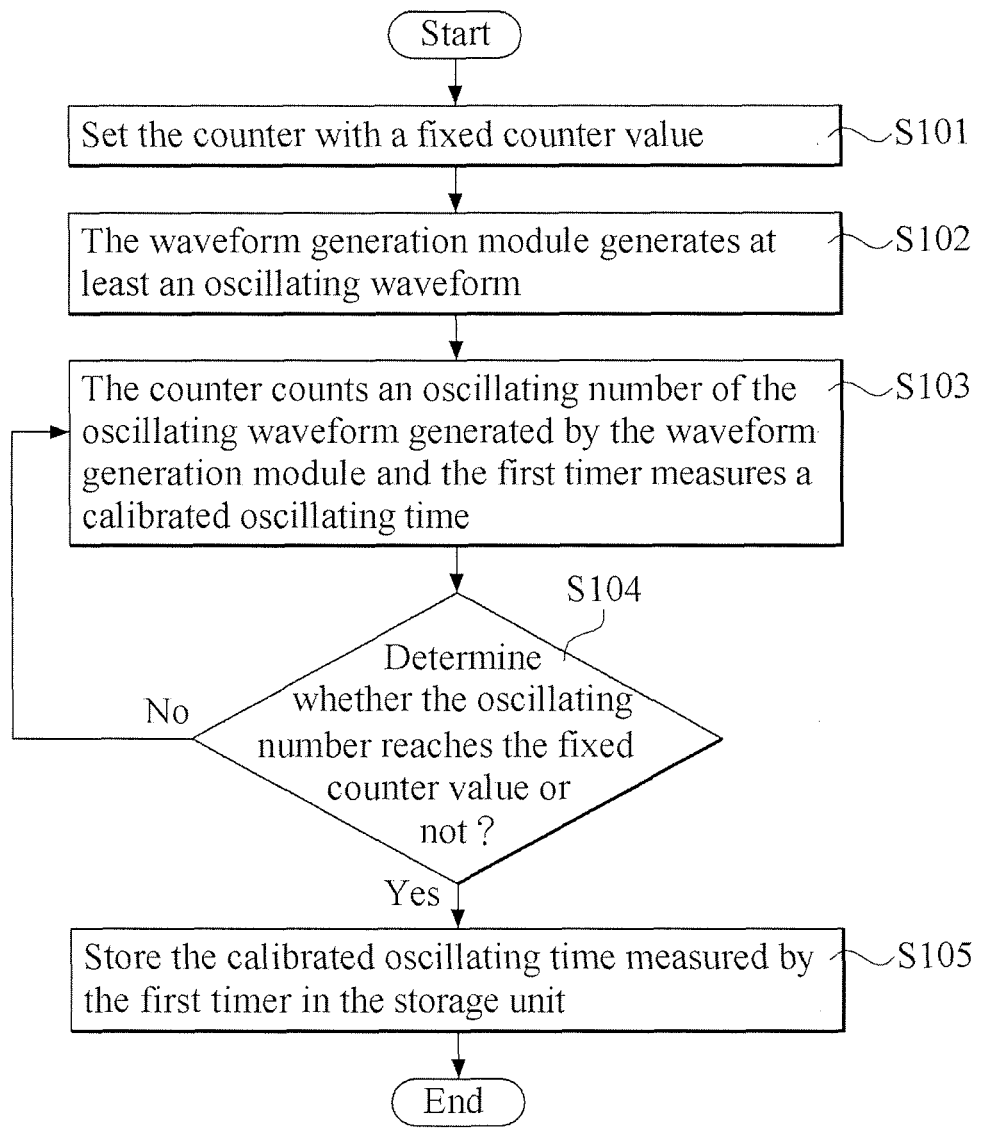
FIG. 6 is a flow chart showing a touch calibration method in accordance with a preferred embodiment of the present invention.

FIG. 6 is a flow chart showing a touch calibration method in accordance with a preferred embodiment of the present invention. As shown, the touch calibration method is applicable to the touch calibration system 1 as shown in FIG. 3 and proceeds the following steps under a calibration mode (the calibration mode is also defined as that the touch pad 11 stops receiving a touch signal generated from a user):

Step S101: setting the counter 13 with a fixed counter value.

Step S102: generating, by the waveform generation module 12, at least an oscillating wave.

Step S103: counting, by the counter 13, an oscillation number of the oscillating wave generated by the waveform generation module 12 and measuring, by the first timer 14, a calibrated oscillating time.

Step S104: determining whether the oscillation number reaches the fixed counter value.

Step S105: storing, in the storage module 15, the calibrated oscillating time measured by the first timer 14.

The content of steps S101 to S105 are identical to the aforementioned description of the touch calibration system 1 and thus is not repeated here.

Figure 7:
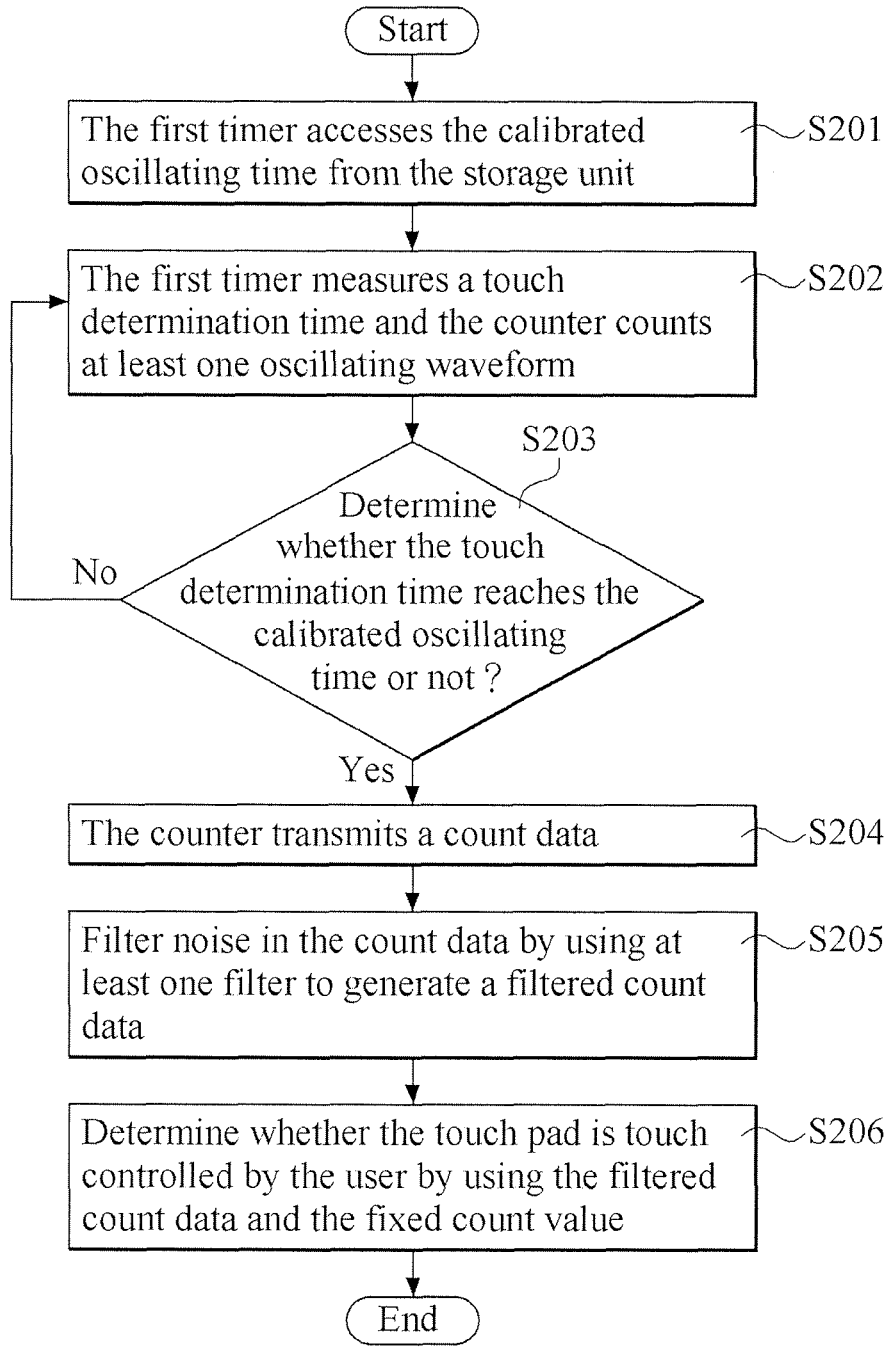
FIG. 7 is a flow chart showing a touch determination method in accordance with a preferred embodiment of the present invention.

Please refer to FIG. 7 and FIG. 8, wherein FIG. 7 is a flow chart showing a touch determination method in accordance with a preferred embodiment of the present invention and FIG. 8 is a schematic view of a count data waveform in accordance with a preferred embodiment of the present invention. As shown, after storing the calibrated oscillating time in the storage module 15 to complete the calibration, the aforementioned touch calibration system can be used in the actual touch circuit for determining whether the user touch the touch pad 11. The method for determining whether there exists a touch comprises the following steps:

Step S201: accessing, by the first timer 14, the calibrated oscillating time from the storage module 15.

Step S202: measuring, by the first timer 14, a touch determination time, and counting, by the counter 13, at least one oscillating wave.

Step S203: determining whether the touch determination time reaches the calibrated oscillating time.

Step S204: transmitting, by the counter 13, a count data.

Step S205: filtering, by at least one filter, noise in the count data to generate a filtered count data.

Step S206: determining whether the touch pad 11 is touch controlled by the user by using the filtered count data and the fixed count value.

Because the first timer 14 is composed of a plurality of T-type flip-flops, in step S201, the reset/set (RS) output can be read as the calibrated oscillating time stored in the storage module 15 of the second timer. In step S202, as the waveform generation module 12 generating the oscillating wave (not shown), the first timer 14 begins measuring the touch determination time and the counter 13 counting the at least one oscillating wave synchronously. In step S203, as it is determined that the touch determination time reaches the calibrated oscillating time, step S204 would be carried out and the counter 13 would transmit a count data waveform 400 as shown in FIG. 8, i.e. a waveform of number versus time. Because in practice, the waveform would be mixed with some noise, Step S205 is then carried out by using at least one filter in the data computing module 16 to remove the noise in the count data so as to generate a filtered count data (not shown). Two filters is preferred in the present embodiment, however, the present invention is not so restricted. The number of filters would be decided by the need in practice.

Finally, the determination step S206 is carried out. An exemplary method for the determination step is mentioned below. As the calibrated oscillating time is t4, the number corresponding to t4 can be estimated. As the number is one and the fixed count value is two, the fixed count value is greater than the number corresponding to t4 and thus it is preliminarily determined that the touch pad 11 is touch controlled. It should be noted that the above mentioned method is a simplified method, in practice, the fixed count value might be a large number, such as ten-thousand (denoted as f1) for example, and the counted number (denoted as f2) is also a large number, then, the determination step may be carried out by comparing f2 with f1 subtracted by 6% of f1, i.e. by using the function: $f2<f1*94\%$, to determine whether there is a touch. However, the present invention is not so restricted.

Figure 1:
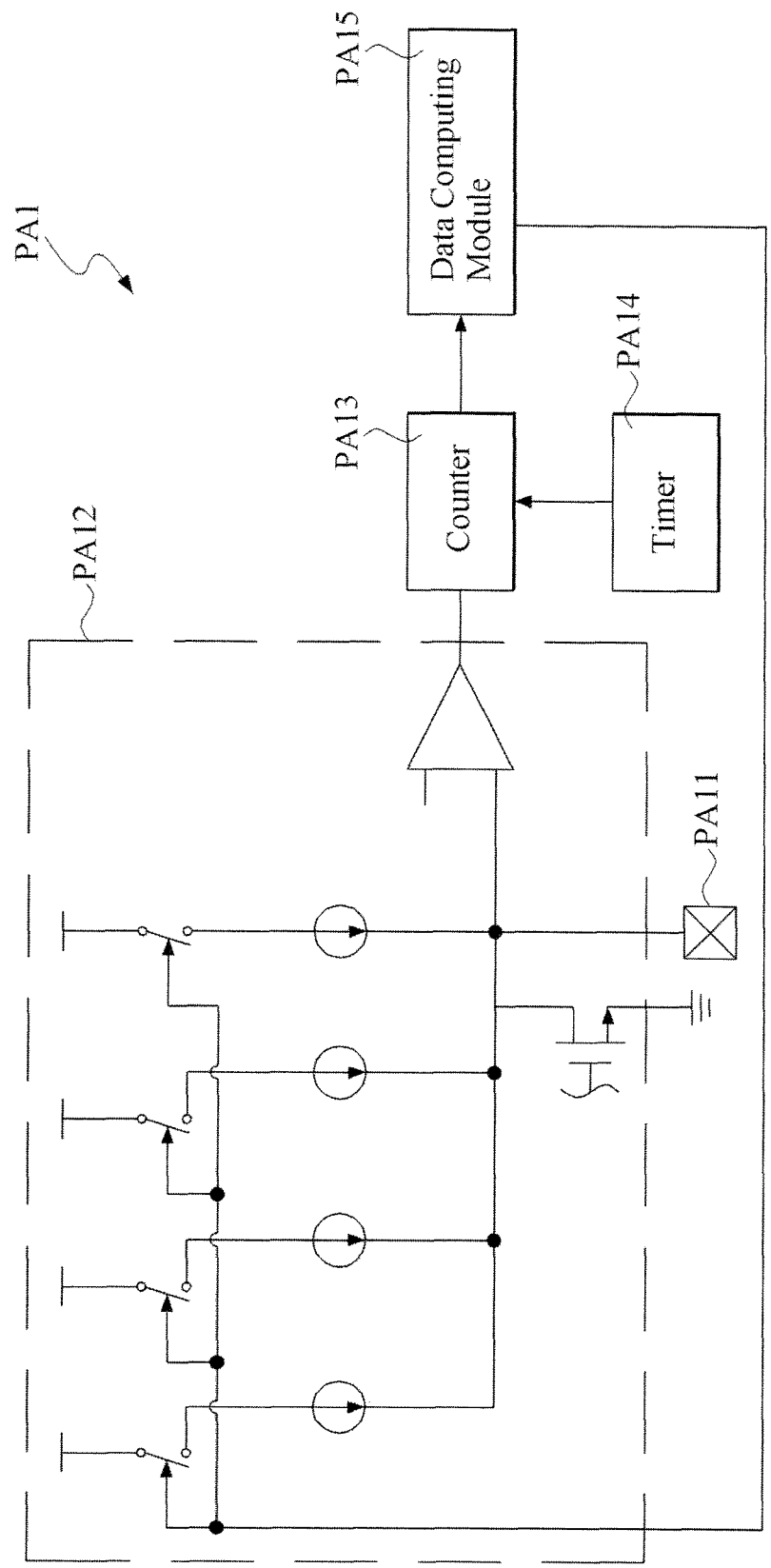
FIG. 1 is a block diagram of a conventional touch calibration system.

It is noted that, because the fixed count value is used in the present invention, the comparator of the waveform generation module 12 does not need a reference voltage and a constant current with precise value (i.e. the value, such as the level of the reference voltage or the number of constant currents, does not need to be calibrated for the specific purpose). Thus, in compared with the conventional technology shown in FIG. 1, the present invention does not need to choose the number of constant currents for accessing a better signal to noise ratio such that the calibration cost can be effectively reduced.

In conclusion, by using the touch calibration system and the calibration method of the present invention, because a fixed counter value is measured, the touch calibration process can be completed with only one calibration step without the need of charging the constant current capacitor or the grounded capacitor repeatedly. In the present invention and thus the time consumption can be reduced to enhance convenience in practice.

The detail description of the aforementioned preferred embodiments is for clarifying the feature and the spirit of the present invention. The present invention should not be limited by any of the exemplary embodiments described herein, but should be defined only in accordance with the following claims and their equivalents. Specifically, those skilled in the art should appreciate that they can readily use the disclosed conception and specific embodiments as a basis for designing or modifying other structures for carrying out the same purposes of the present invention without departing from the scope of the invention as defined by the appended claims.

What is claimed is:

1. A touch calibration system, comprising:
   a touch pad;
   a waveform generation module, electrically connected to the touch pad for generating at least an oscillating wave;
   a counter, electrically connected to the waveform generation module and set with a fixed counter value, for counting an oscillation number of the oscillating wave generated by the waveform generation module under a calibration mode, and transmitting a count signal representing the oscillation number when the oscillation number reaches the fixed count value;
   a first timer, electrically connected to the timer, for measuring a calibrated oscillating time, and for receiving the count signal to transmitting a timer signal representing the calibrated oscillating time measured by the first timer; and
   a storage module, electrically connected to the first timer, for receiving the timer signal to store the calibrated oscillating time to complete the calibration mode;
   wherein the calibration mode is defined as that the touch pad stops receiving a touch signal generated from a user,
   wherein the storage module is a second timer, which is composed of a plurality of D-type flip-flops.

2. The touch calibration system of claim 1, wherein the first timer is composed of a plurality of T-type flip-flops.

3. The touch calibration system of claim 1, wherein the waveform generation module is a relaxation oscillator circuit.

4. A touch calibration method, applicable to a touch calibration system, for calibrating the touch calibration system under a calibration mode, the touch calibration system including a touch pad, a waveform generation module a counter, a first timer, and a storage module, wherein the waveform generation module is electrically connected to the touch pad, the counter is electrically connected to the waveform generation module, the first timer is electrically connected to the counter, the storage module is electrically connected to the first timer, and the method comprising:
   (a) setting the counter with a fixed counter value;

(b) generating, by the waveform generation module, at least an oscillating wave;

(c) counting, by the counter, an oscillation number of the oscillating wave generated by the waveform generation module and measuring, by the first timer, a calibrated oscillating time;

(d) determining whether the oscillation number reaches the fixed counter value; and (e) if the determination of step (d) is yes, storing, in the storage module, the calibrated oscillating time measured by the first timer;

wherein the calibration mode is defined as that the touch pad stops receiving a touch signal generated from a user; and wherein the storage module is a second timer, which is composed of a plurality of D-type flip-flops.

5. The touch calibration method of claim 4, wherein the first timer is composed of a plurality of T-type flip-flops.

6. The touch calibration method of claim 4, wherein the waveform generation module is a relaxation oscillator circuit.

* * * * *